(12) United States Patent
Chen et al.

(10) Patent No.: US 7,754,601 B2
(45) Date of Patent: Jul. 13, 2010

(54) SEMICONDUCTOR INTERCONNECT AIR GAP FORMATION PROCESS

(75) Inventors: Hsien-Wei Chen, Sinying (TW); Shin-Puu Jeng, Hsinchu (TW); Hao-Yi Tsai, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 12/132,233

(22) Filed: Jun. 3, 2008

(65) Prior Publication Data

US 2009/0298256 A1 Dec. 3, 2009

(51) Int. Cl.
*H01L 21/4763* (2006.01)

(52) U.S. Cl. .................. 438/637; 438/675; 438/740; 257/E21.575; 257/E21.585

(58) Field of Classification Search .............. 438/584, 438/589, 618, 619, 636, 637, 675, 692, 740, 438/400, 410, 431; 257/774, E23.143, E23.145, 257/E21.575, E21.586, E21.627, E21.641, 257/E21.579, E21.585
See application file for complete search history.

(56) References Cited

U.S. PATENT DOCUMENTS

| | | | |
|---|---|---|---|
| 5,521,114 A * | 5/1996 | Rajeevakumar ............. 438/386 |
| 6,004,883 A | 12/1999 | Yu et al. |
| 6,127,711 A | 10/2000 | Ono |
| 6,268,261 B1 | 7/2001 | Petrarca et al. |
| 6,271,136 B1 * | 8/2001 | Shue et al. .................. 438/687 |
| 6,610,593 B2 | 8/2003 | Kohl et al. |
| 6,635,967 B2 | 10/2003 | Chang et al. |
| 6,660,661 B1 | 12/2003 | Ben-Tzur et al. |
| 6,841,878 B1 | 1/2005 | Ben-Tzur et al. |
| 6,903,002 B1 | 6/2005 | Ben-Tzur et al. |
| 6,946,384 B2 | 9/2005 | Kloster et al. |
| 6,949,456 B2 | 9/2005 | Kumar |
| 2005/0074960 A1 | 4/2005 | Gueneau de Mussy et al. |
| 2005/0074961 A1 * | 4/2005 | Beyer et al. .................. 438/619 |
| 2007/0178713 A1 | 8/2007 | Jeng |
| 2008/0136038 A1 * | 6/2008 | Savastiouk et al. .......... 257/774 |

* cited by examiner

*Primary Examiner*—Khiem D Nguyen
(74) *Attorney, Agent, or Firm*—Duane Morris LLP; Frank J. Spanitz

(57) ABSTRACT

A semiconductor package including an interconnect air gap and method for making the same. The semiconductor package includes a dielectric layer, a metallic interconnect, an air gap disposed between the dielectric layer and interconnect, and a spacer interspersed between the metallic interconnect and air gap. The metallic interconnect is laterally supported by and isolated from the air gap by the spacer. A method for making the same is also provided.

7 Claims, 7 Drawing Sheets

SEMICONDUCTOR INTERCONNECT AIR GAP FORMATION PROCESS

FIELD OF THE INVENTION

The present invention generally relates to semiconductors, and more particularly to semiconductor packages with air gaps and methods for fabricating the same.

BACKGROUND

Modern semiconductor device packages are formed from multiple stacked layers of materials that may include numerous electrically active components that are electrically coupled together by metal conductor interconnects. Although aluminum conductors with silicon dioxide disposed between such interconnects have been used in the past, current practices in fabricating high speed semiconductor devices and have moved toward using a combination of copper interconnects with suitable dielectric materials or films sash as low-k dielectrics to take advantage of the superior conductivity of copper compared to aluminum and reduced parasitic capacitance between the conductors. This has reduced resistive capacitance delay ("RC delay") which limits increases in clock speed in integrated circuits and semiconductor devices.

Back end-of-line ("BEOL") processes are used to create the intricate network of conductor interconnects in each layer and between the multiple layers wherein copper is laid into the dielectric material. An additive patterning processes, referred to as damascene and dual damascene, are some BEOL process used to form the patterned copper conductor interconnect circuit(s) which interconnect various active components (e.g., resistors, transistors, etc.) disposed in the single and multiple layers throughout the microchip. Some of these interconnect circuit structures include trenches which are filled with the copper conductor and vias which are essentially metal-plated or filled holes that electrically connect the conductors between the layers in the semiconductor packages.

These open trench and via structures are formed in dielectric material using various photolithography and material removal processes such as anisotropic dry gas plasma etching. Dry etching is performed in an etcher machine by applying an electromagnetic energy source (such as RF) to a gas containing a suitable chemically reactive element that reacts with the material to be etched or removed. The gas plasma emits positively charged ions that strike and dissolve the dielectric material. By using a combination of hard masks and/or patterned photoresist layers above the dielectric material layer having openings configured in the shape of the circuit desired to be formed, various patterns of recessed trench and via openings can be made in the dielectric material since dielectric material beneath the hard mask and photoresist will not dissolve. Became the ions strike the dielectric material essentially perpendicular to its surface in anisotropic dry plasma etching, vertical trench and via profiles can be created with virtually no undercutting beneath the hard mask and photoresist.

After the trenches and vias are formed by dry etching, copper may be deposited in these open structures in the dielectric by any suitable known technique such as chemical vapor deposition (CVD), physical vapor deposition (PVD), Plasma-Enhanced Chemical Vapor Deposition (PECVD), electro-chemical plating (ECP), electroless-plating, etc. Subsequent processes such as chemical mechanical planarization (CMP) or etching may be used in some instances as needed to polish and plane the top surface of the dielectric material layer, thereby leaving an essentially flat surface on which subsequent layers of dielectric with interconnects can be built.

Line-to-line capacitance (between interconnect lines) has become an increasingly limiting factor on microprocessor clock speeds as processes have been scaled down, for example to current 90 nm (nanometer) and 65 nm processes, and newest 45 nm process. Low-k dielectric materials, such as Black Diamond® available from Applied Materials, Incorporated® which has a dielectric constant (k) lower than 3, have been used to better electrically isolate interconnects and reduce line-to-line capacitance for 90 nm and below processes, thereby concomitantly reducing resistive capacitance delay (RC delay) which hinders processor speeds. Further reduction of RC delay has been attempted by the introduction of porous ultra low-k dielectric materials (k generally equal to or less than about 2.5) such as Black Diamond II® which is targeted for the newer 45 nm process. Although the porosity introduced into this dielectric further improves interconnect isolation by lowering the dielectric constant k, it also decreases the mechanical modulus making the material more brittle that prior low-k materials and susceptible to damage.

The use of air gaps in semiconductor device packages and structures to enhance interconnect isolation is known. Since air has the lowest k of any material (k=1), a growing trend has been to incorporate air gaps into multi-layered semiconductor structures to isolate interconnects and reduce line-to-line capacitance and RC delay. U.S. Patent Application Publication Nos. 2005/0074960 and 2005/0074961, each incorporated herein by reference in their entireties, describe integration of interconnect isolation air gaps into a semiconductor structure. However, these prior methods are less to ideal. Referring to FIG. 1 showing a prior art design excerpted from Publication No. 2005/0074961, a semiconductor with interconnect air gaps consists of a copper conductor and metal barrier layer (intended to isolate the copper conductor to prevent copper migration into the dielectric material) that lies adjacent to the open space created by the air gap. This arrangement creates EM (electromigration) reliability concerns because the metal conductors lack lateral support and may become easily extruded or deformed into the adjacent open air space in higher current flux situations when the semiconductor device is in use.

An improved multi-layered semiconductor structure with interconnect air gaps and method for fabricating the same is desired.

SUMMARY

A multi-layered semiconductor package structure and method for making the same is provided. The semiconductor structure and method according to principles of the present inversion integrates air gaps for isolating the metallic interconnect conductors to reap the benefits of lowering RC delay, yet provides lateral support for the metallic interconnect conductors to address EM reliability concerns.

According to one embodiment, a semiconductor package with interconnect air gaps includes a dielectric layer; a metallic interconnect; an air gap disposed between the dielectric layer and interconnect; and a spacer interspersed between the metallic interconnect and air gap. The metallic interconnect is laterally supported by and isolated from the air gap by the spacer. In one embodiment, the metallic interconnect is formed of copper and a barrier layer thereon, which in some embodiments the barrier layer may be TaN. In some preferred embodiments, the spacer has a depth that does not extend below an etch stop layer embedded and formed in the semiconductor package.

According to another embodiment, a method for forming a semiconductor includes: providing a dielectric layer overlying a substrate; forming an interconnect recess in the dielectric layer; treating at least a portion of the exposed dielectric sidewall to form a treated sidewall portion; forming a spacer material on the exposed dielectric sidewall in the recess; forming a conductive material in the recess adjacent to the spacer material; and removing the treated portion of the dielectric sidewall to form an air gap between the spacer material and the dielectric layer. In some embodiments, an etch stop layer or capping layer is disposed between the substrate and dielectric layer. In one preferred embodiment, the recess forming step does not penetrate the etch stop layer or capping layer.

According to one embodiment, a method for forming a multi-layered semiconductor structure with air gaps includes: providing a multi-layered semiconductor structure including a silicon substrate, an etch stop layer thereon, a dielectric layer thereon, and a protective coating thereon being resistant to at least ashing to protect the dielectric layer; forming an interconnect recess through the protective coating and into the dielectric layer for creating an electrical interconnect, the recess creating an exposed sidewall in the dielectric layer and in some preferred embodiments the recess does not penetrate the etch stop layer; oxidizing at least a portion of the exposed dielectric sidewall to form an oxidized sidewall portion; depositing a spacer material on the exposed dielectric sidewall in the recess; depositing an electrically conductive material in the recess; and dissolving the oxidized portion of the dielectric sidewall to form an air gap between the spacer material and the dielectric layer. The electrically conductive material is supported by and isolated from the air gap by the spacer material. In one embodiment, the electrically conductive material includes copper.

According to another embodiment, a method for forming a multi-layered semiconductor structure with air gaps includes: providing a multi-layered semiconductor package including a silicon substrate, an etch stop layer thereon, a dielectric layer thereon, and a protective coating thereon being resistant to at least ashing to protect the dielectric layer; forming a recess through the protective coating and into the dielectric layer for receiving a metallic conductor material to form an electrical interconnect, wherein an exposed sidewall is defined in the dielectric layer; oxidizing at least a portion of the exposed dielectric sidewall to form an oxidized sidewall portion; depositing a spacer material on the exposed dielectric sidewall in the recess; and dissolving the oxidized portion of the dielectric sidewall with a hydrofluoric acid solution to form an air gap between the spacer material and the dielectric layer. The electrically conductive material is supported by and isolated from the air gap by the spacer material.

According to yet another embodiment, a method for forming a multi-layered semiconductor structure includes: forming an etch stop layer on a silicon substrate; forming a dielectric layer on the etch stop layer; forming an anti-reflective coating on the dielectric layer; forming a patterned photoresist layer on the anti-reflective coating; using an etching gas to form an interconnect recess in the dielectric layer for creating an electrical interconnect, the recess defining an exposed sidewall in the dielectric layer and further exposing the etch stop layer; using an ashing gas to oxidize at least a portion of the exposed dielectric sidewall; depositing a sidewall protective layer on the anti-reflective coating, oxidized portion of dielectric sidewall to encapsulate the oxidized portion, and the etch stop layer; using an anisotropic etching gas process to remove the sidewall protective layer from the etch stop layer and anti-reflective coating, wherein at least a portion of the sidewall protective layer remains to define a spacer; depositing an electrically conductive material in the recess adjacent to the spacer; removing the anti-reflective coating to expose at least an upper portion of the oxidized portion of the dielectric sidewall; and removing the oxidized portion of the dielectric sidewall to form an air gap between the spacer and the dielectric layer. The electrically conductive material is supported by and isolated torn the air gap by the spacer.

BRIEF DESCRIPTION OF THE DRAWINGS

The features of the preferred embodiments will be described with reference to the following drawings where like elements are labeled similarly, and in which.

Figure 1:
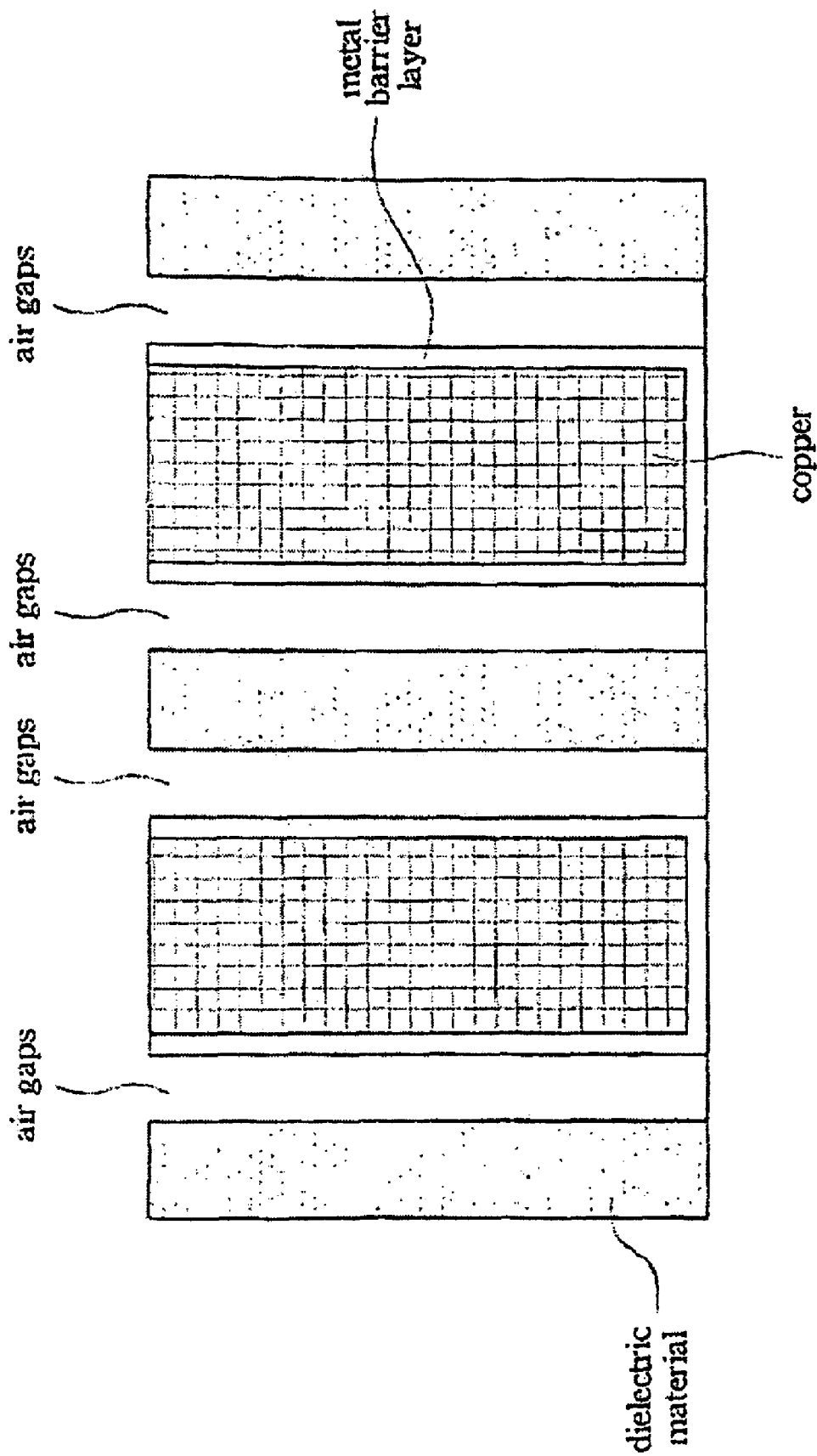
FIG. 1 shows a conventional prior art semiconductor package structure having interconnect air gaps.

All drawings are schematic and are not drawn to scale.

DETAILED DESCRIPTION

This description of illustrative embodiments is intended to be read in connection with the accompanying drawings, which are to be considered part of the entire written description. In the description of embodiments disclosed herein, any reference to direction or orientation is merely intended for convenience of description and is not intended in any way to limit the scope of the present invention. Relative terms such as "lower," "upper," "horizontal," "vertical," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise. Moreover, the features and benefits of the invention are illustrated by reference to the preferred embodiments. Accordingly, the invention expressly should not be limited to such preferred embodiments illustrating some possible non-limiting combination of features that may exist alone or in other combinations of features; the scope of the invention being defined by the claims appended hereto.

One embodiment of an exemplary process for forming electrical interconnect air gaps in a semiconductor substrate package is illustrated in FIGS. 2-9, which shows sequential cross-sectional side views through the semiconductor during copper interconnect formation damascene processes. A "damascene" process generally describe the process wherein a single interconnect feature (e.g. via or trench) is formed and filled with copper per stage. A "dual damascene" processes generally describes a process wherein two interconnect features are formed and filled with copper at once (e.g., features of a trench overlying a via may both be filled with a single copper deposition step). The present invention is not limited to use in either process alone.

As illustrated in FIGS. 2-9 and described herein, a process is provided that advantageously produces a multi-layered semiconductor package having interconnect air gaps and laterally-supported interconnects to address EM reliability concerns with prior unsupported interconnects as described herein. A preferred combination of material selection, ashing and etching gas chemistries or other material removal techniques, and sequence of fabrication steps to selectively remove portions of material may advantageously be employed to produce isolated and well-supported interconnects.

It should be noted that the Damascene processes described herein preferably use anisotropic dry gas plasma etching and ashing, which are preferred material removal methods for making copper/low-k dielectric semiconductors. Etching and ashing processes are generally directed to the selective removal of different types of materials. Because the chemical composition of materials varies, it is known in the art that different types of materials require different types of gases with certain reactive agents for material removal. Accordingly, certain materials will be partially or completely resistant to material removal depending on the etching or ashing gas chemistry used.

Etching gas plasmas are typically used for material removal from dielectric layers (e.g., to form vias and trenches). Etching processes using etching gas plasmas are generally performed at lower temperatures and pressures than ashing. Ashing gas plasmas are typically used for selectively removing materials such as photoresists and those materials with similar chemistries. Ashing gas plasmas are generally less aggressive than etching gas plasmas. Ashing with ashing gas plasmas are generally performed at higher temperatures and pressures than etching processes. The terms "etching" and "ashing" are used herein consistent with respect to the foregoing description of each process.

The semiconductor etching and ashing processes described herein can be performed in an etcher chamber of a commercially-available etching tool, such as those supplied by Applied Materials, Incorporated.® In contrast to wet etching procedures, anisotropic dry plasma etching and ashing enables vertical etching to be performed that produces substantially uniform and straight vertical walls for via and trenches profiles.

Figure 2:
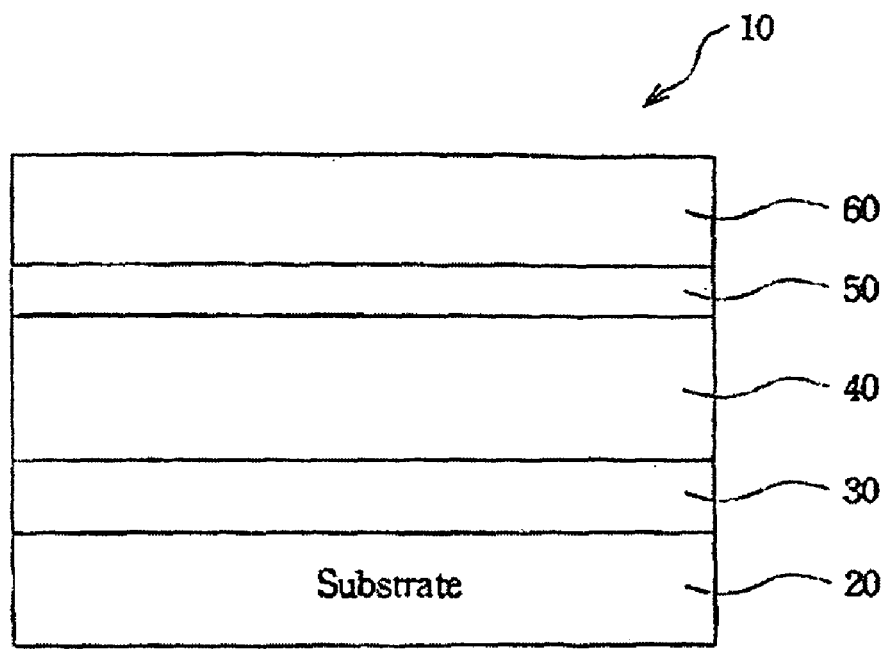
FIGS. 2-9 show an exemplary semiconductor package structure and sequential cross-sectional side views through the semiconductor during an exemplary process of forming interconnect air gaps with spacers.

Beginning now with initial reference to FIG. 2, a multi-layer semiconductor 10 may be created by sequentially forming (from the bottom upwards) an etch stop layer 30 on a conventional semiconductor silicon substrate 20, a dielectric layer 40 thereon, and preferably an anti-reflective coating 50 thereon. A photoresist layer 60 is preferably also provided thereon to be subsequently patterned using conventional photolithography techniques as well known to those skilled in the art. The photoresist layer 60 will facilitate the formation of interconnect recesses such as vias and/or trenches in dielectric layer 40 that will subsequently receive electrically conductive materials to form the interconnects. In some embodiments, etch stop layer 30 may be a capping layer formed on top of a previously constructed single damascene or dual damascene substrate which may include conductive paths, and active and passive devices. Such capping layer formation is described in commonly assigned U.S. patent application Ser. No. 11/342,099, which is incorporated herein by reference in its entirety.

Etch stop layer 30 may be any suitable conventional material used in semiconductor fabrication processes, such as for example without limitation silicon nitride (SiN), (silicon carbide) SiC, and silicon oxynitride (SiON). Etch stop layer 30 assists in controlling etching depth during the damascene or dual damascene processes. Anti-reflective coating 50 may be any suitable conventional material used in semiconductor fabrication processes, such as without limitation SiN, SiON, oxidized films (OX), and nitride-free coating materials. Anti-reflective coating 50 helps decrease reflection of light from dielectric layer 40 into photoresist layer 60 during photolithographic patterning of the photoresist to prevent exposing unintended areas of that material.

Preferably, materials selected for both etch stop layer 30 and anti-reflective coating 50 are preferably resistant to conventional ashing gas chemistries, and more preferably to oxygen plasma ashing gas in a preferred embodiment for process reasons further described herein. However, the materials selected for etch stop layer 30 and anti-reflective coating 50 are preferably both susceptible to etching by conventional anisotropic dry gas plasma etching chemistries, such as without limitation elemental fluorine F, $CF_4$, $C_4F_8$, $CHF_3$, $CH_2F_2$, or $C_5F_8$. Other suitable etching gases, however, may also be used. The type of etching gas used will depend on the material selected for both anti-reflective coating 50 and etch stop layer 30, both of preferably are susceptible to etching using the same etching gas so that a single etching chamber may be used.

Dielectric layer 40 may be any suitable conventional material used in semiconductor fabrication processes. In a preferred embodiment, dielectric layer 40 preferably is made of a low-k dielectric material having a dielectric constant k less than or equal to 3, such as Black Diamond® available from Applied Materials, Incorporated®. Other suitable dielectric insulating materials, however, may be used such as without limitation fluorinated silicate glass (FSG) or undoped silicate glass (USG). In a preferred embodiment, the material selected for dielectric layer 40 is preferably susceptible to etching by conventional anisotropic dry gas plasma etching chemistries such as those described herein. An appropriate thickness of dielectric layer 40 may be selected based on the semiconductor package design requirements.

Etch stop layer 30, dielectric layer 40, anti-reflective coating 50, and photoresist layer 60 may be deposited in the formation of semiconductor 10 by any suitable conventional method as well known to those skilled in the art of semiconductor fabrication, such as for example PVD, PECVD, CVD, MVC, ECP, etc.

A preferred method for forming a multi-layered semiconductor structure with interconnect air gaps will now be described with reference to FIGS. 2-9. Starting with FIG. 2, a semiconductor 10 is provided having the structure described above. The photoresist layer 60 is first patterned using a conventional photolithography and photoresist developing techniques including in some embodiments a mask or reticle supported above the photoresist layer and a light source to expose selective portions of the photoresist material. This results in a patterned photoresist layer 60 as shown in FIG. 2 having a desired pattern for forming vias and trenches to receive interconnect conductive materials later in the process.

Figure 3:
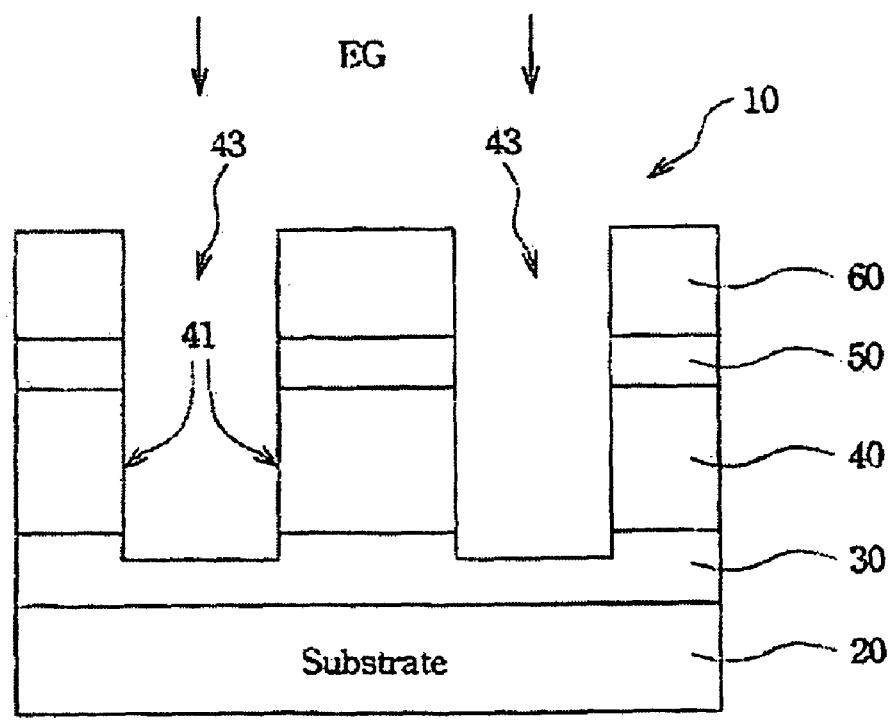

In the next step, the semiconductor 10 is next exposed to an etching gas (denoted "EG" in the figures) which is used to transfer the pattern from photoresist layer 60 into the anti-reflective coating 50 and dielectric layer 40 resulting in the semiconductor structure shown in FIG. 3. This produces recesses 43 in the semiconductor 10 which will subsequently be filled with conductive interconnect materials. As shown, the etching step exposes portions of dielectric layer 30 to form and define vertical sidewalls 41, a portion of which will subsequently be used to create interconnect air gaps as further described herein.

Figure 10:
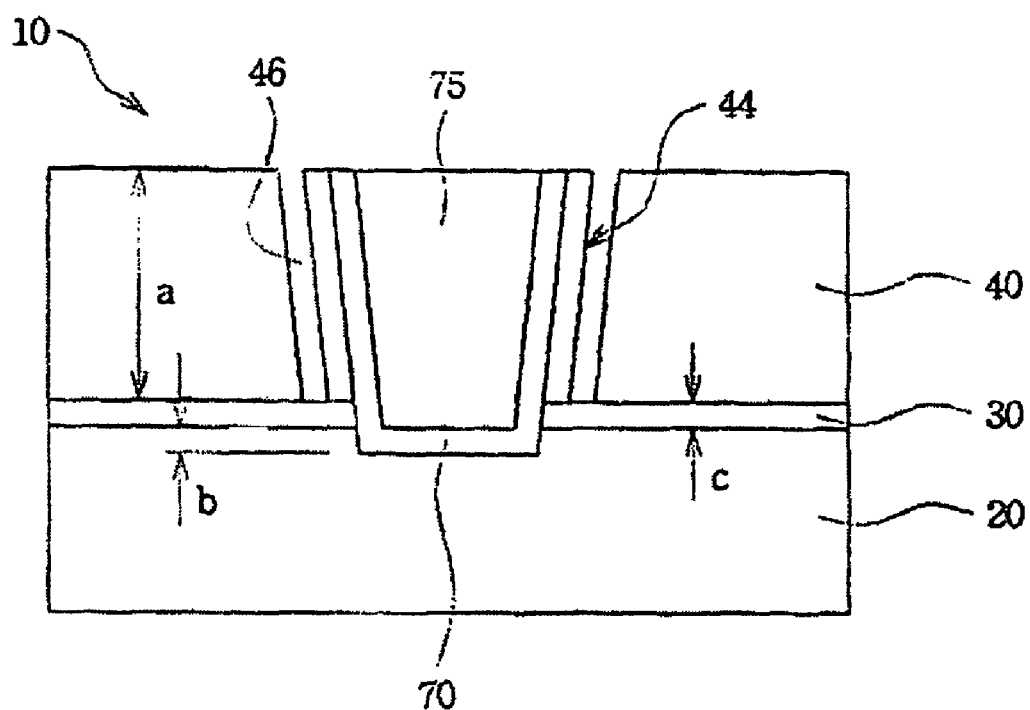
FIGS. 10 and 11 show two semiconductor package structures formed according to the exemplary process of FIGS. 2-9.

In the preferred embodiment, the etching process in FIG. 3 is carefully controlled and stopped after reaching the top interface surface of etch stop layer 30 or slightly into the etch stop layer as shown. Preferably, the etching does not fully penetrate through etch stop layer 30 and into semiconductor substrate 20 as shown in FIG. 3. This results in a final interconnect structure as shown in FIG. 10, which advantageously reduces penetration of the interconnect conductor into substrate 20 and thereby reduces parasitic capacitance between conductors and interconnects as further explained herein. In other possible embodiments, however, the etching may extend through etch stop layer 30 and partially into the substrate 20, which results in a final interconnect structure shown in FIG. 11.

Generally, the first etch step shown in FIG. 3 can be controlled to stop etching at the top interface surface of etch stop layer 30 or slightly into layer 30 by selecting an appropriate operating mode of the commercially-available etching tool that may be used in the process. The etching tool may be set to "end point detected mode". When the etching tool detects a different signal being received from etch stop layer material 30 (shown in FIG. 3) in the etching process, the system will be stopped to prevent penetrating etch stop layer 30.

Figure 4:
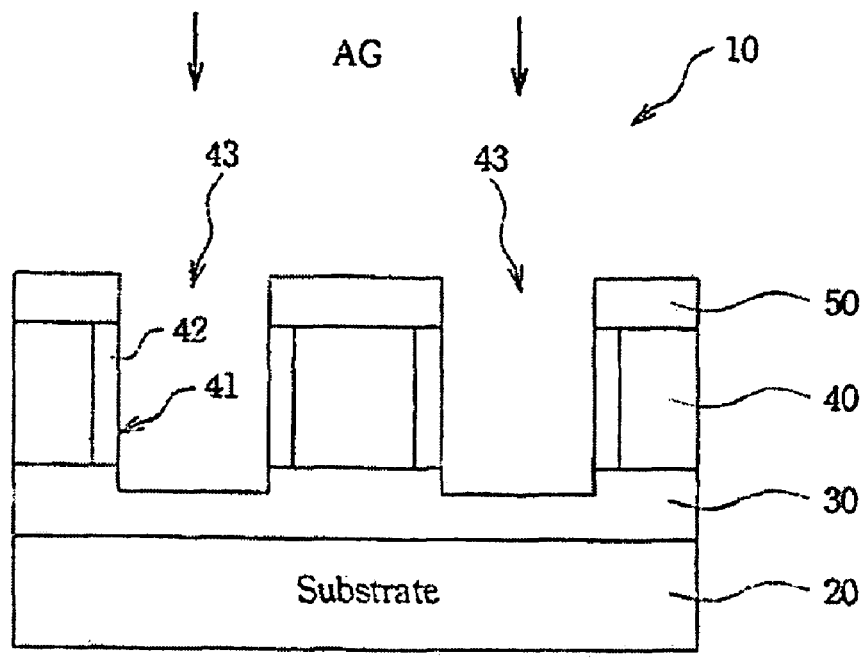

In the next step, with reference to FIG. 4, dry ashing is conducted to remove photoresist layer 60 preferably by exposing semiconductor 10 to an ashing gas (denoted "AG" in the figures). Preferably, the ashing gas used is an oxygen $O_2$ plasma ashing gas. The ashing gas does not substantially effect etch stop layer 30 and anti-reflective coating 50, which preferably are both made of materials selected not to be appreciably susceptible to reduction by the ashing gas. Accordingly, anti-reflective coating 50 protects the top surface of dielectric layer 40 while etch stop layer 30 protects substrate 20 as shown in FIG. 4.

With continuing reference to FIG. 4, at least a portion of exposed sidewalls 41 of dielectric layer 40 are treated by the ashing gas and intentionally damaged or oxidized by reaction of the oxygen ashing gas plasma with the dielectric material to produce a temporary, expendable oxidized sidewall portion of the dielectric that will later be removed during the fabrication process to produce an air gap. Preferably, the treated or oxidized sidewall portion 42 includes at least a portion of sidewalls 41, and more preferably the majority of exposed sidewalls 41 in the preferred embodiment. In some embodiments, the oxidized portion 42 may contain SiOH resulting from a chemical reaction of the dielectric material with an oxygen plasma ashing gas which preferably may be used. The length of time that sidewalls 41 are exposed to the ashing gas, thereby allowing the ashing gas to diffuse into the dielectric material, can be used to control the depth of oxidized portion 42 (i.e. depth being defined as the lateral extent of oxidation of the dielectric as shown in FIG. 4).

Figure 5:
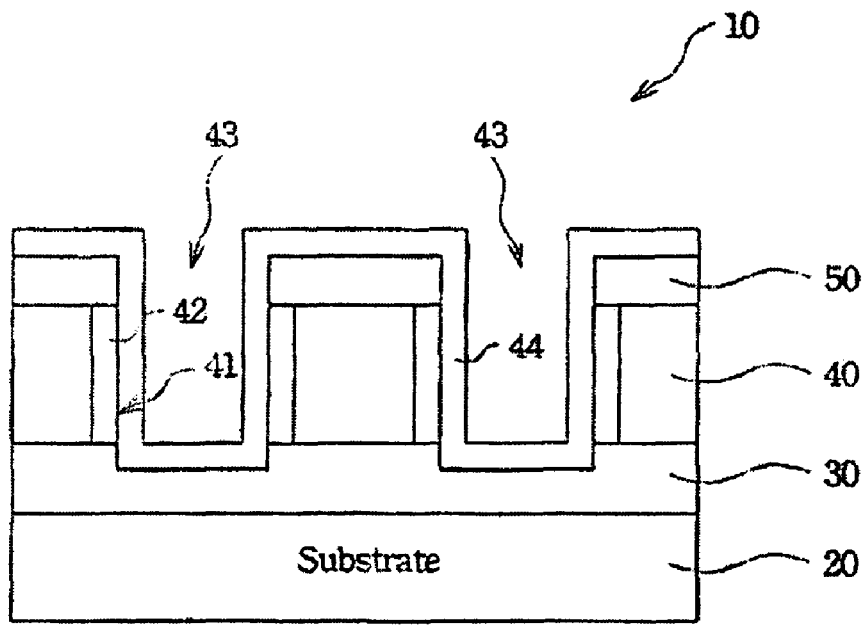

With reference to FIG. 5, the next step in the fabrication process includes depositing a sidewall protection layer 44 on the semiconductor 10, and in particular in recesses 43. Preferably, sidewall protection layer 44 covers and encapsulates the vertical oxidized sidewall portions 42 of the dielectric layer 40 as shown and defines a spacer material or spacer that isolates and supports metal interconnect 75. Also preferably, sidewall protection layer 44 is deposited to also cover the top surface of anti-reflective coating 50 and etch stop layer 30, for reasons further described herein. Sidewall protection layer 44 may be deposited in the formation of semiconductor 10 by any suitable conventional method as well known to those skilled in the art of semiconductor fabrication, such as for example PVD, CVD, PECVD, MVC, ECP, etc.

Preferably, sidewall protection layer 44 is susceptible to etching using an anisotropic etching gas EG such as those described herein or other suitable gas chemistries. More preferably, sidewall protection layer 44 is susceptible to etching using the same etching gas used for etching at least etch stop layer 30, and most preferably dielectric layer 40 and anti-reflective costing 50 to allow a single etching gas may be used in the process. In one embodiment, sidewall protection layer 44 is made of a material like etch stop layer 30, which may include SiN, SiC, and SiON. In a preferred embodiment, sidewall protection layer 44 is made of a material with lower k value and higher mechanical strength, such as LK or FSG. Other suitable materials commonly used in semiconductor fabrication may be used so long as the sidewall protection layer 44 is susceptible to etching by an anisotropic etching gas.

Figure 6:
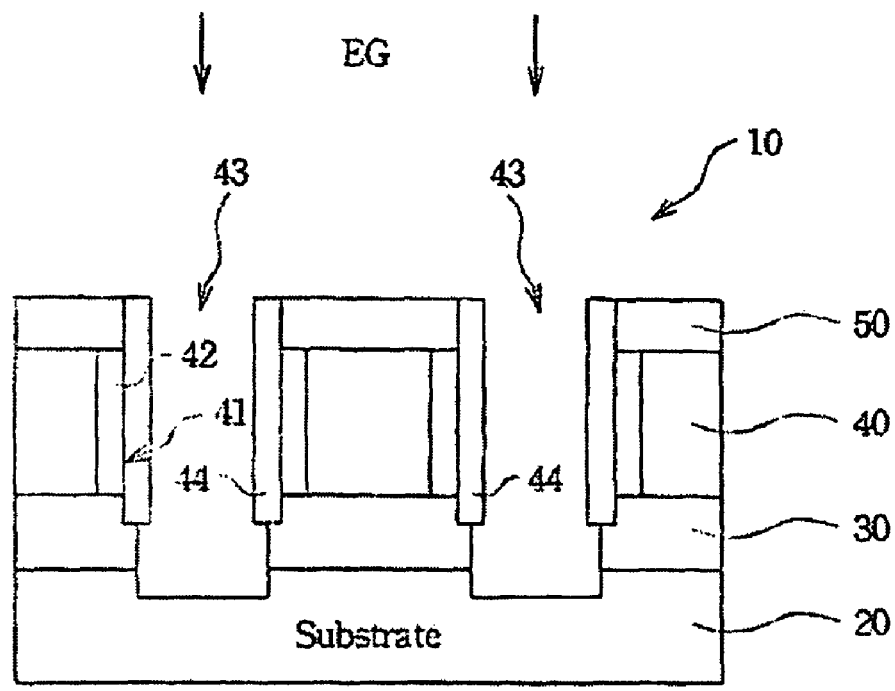

In the next step shown in FIG. 6, an anisotropic etch using etching gas EG is used to selectively remove the majority of sidewall protection layer 44 deposited in the previous step, except for vertical portions of layer 44 in recess 43 lying adjacent to oxidized portion 42 of dielectric layer sidewalls 41. This etching step forms and defines vertically-oriented spacers on the sides of the recesses 43 from sidewall protection layer 44 as shown. Preferably, etch stop layer 30 is also penetrated and removed during this etching step to expose semiconductor substrate 20 at the bottom of recesses 43. It should be noted that with judicious selection of the thickness of anti-reflective coating 50 on top of dielectric layer 40, at least a portion of the anti-reflective coating preferably remains to protect the dielectric layer from the etching gas by the end of the etching step shows in FIG. 6 even though some loss of thickness in the anti-reflective coating may occur.

Figure 7:
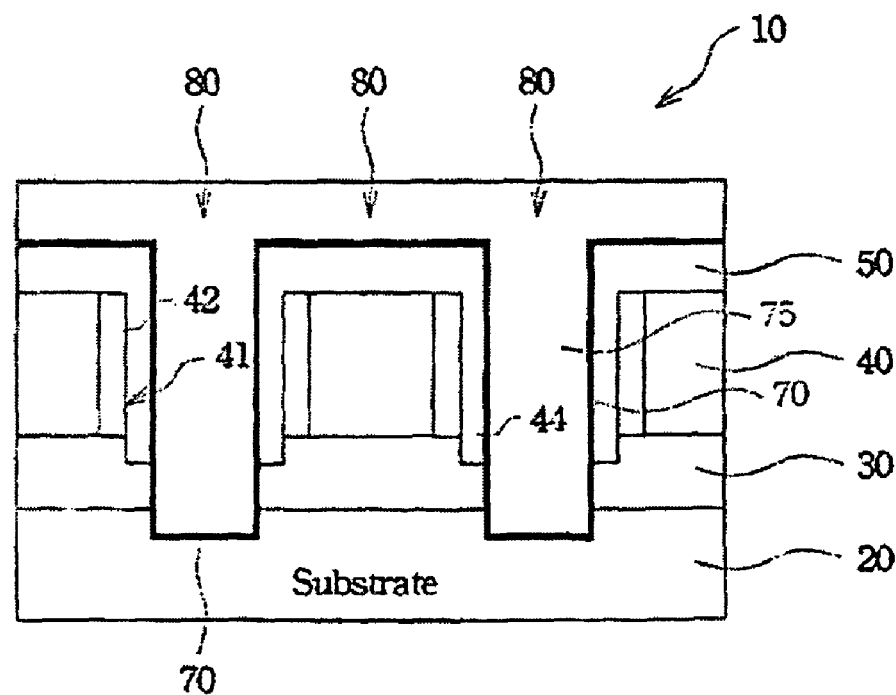

In the next step shown in FIG. 7, the metal interconnects are formed in semiconductor 10 by any conventional manner readily known to those skilled in the art. This step may include first depositing a barrier liner or layer 70 over the substrate and particularly into recesses 43. Barrier layer 70 is intended to prevent direct contact between the metal conductor and silicon substrate 20 to prevent migration of the metal into the substrate. Barrier layer 70 may be any suitable material commonly used in semiconductor fabrication processes, such as without limitation refractory metals like Ta, Ti, W, etc., or alloys thereof, or refraction metal nitrides such as TaN, TiN, WN, etc. In one embodiment, barrier layer 70 may be TaN. Barrier layer 70 may be deposited on semiconductor 10 by any suitable conventional method well known to those skilled in the art of semiconductor fabrication, such as for example PVD, CVD, PECVD, MVC, ECP, etc. In one embodiment, barrier layer 70 is deposited using PVD.

With confirming reference to FIG. 7, a metal conductor 80 is next deposited on barrier layer 70 to complete the electrical interconnects, and preferably fills at least recesses 43 to form interconnect conductors 75. Metal conductor 80 may be any suitable metal commonly used in semiconductor fabrication such as Cu, Al, W, Ag, etc. In the preferred embodiment, conductor 80 is Cu (copper). Metal conductor 80 may be deposited on semiconductor 10 by any suitable conventional method well known to those skilled in the art of semiconductor fabrication, such as for example PVD, CVD, PECVD, MVC, ECP, etc. In one embodiment, metal conductor 80 is deposited using ECP.

Figure 8:
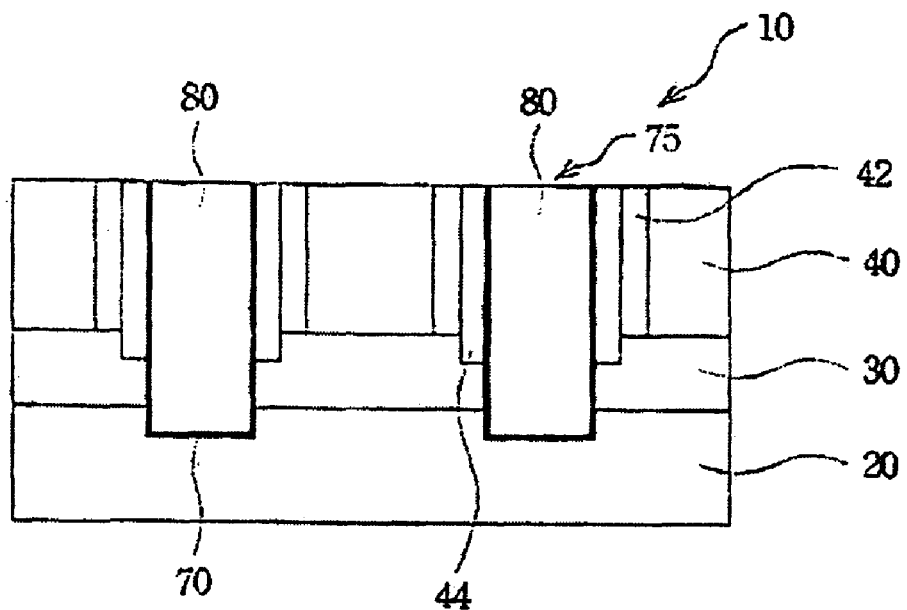

The next step shown in FIG. 8, the top surface of semiconductor 10 is leveled or planed using a material subtractive or removal process that also removes the excess overburden portions of metal conductor 80 and barrier layer 70. In one embodiment, the material removal and planing process used is preferably chemical mechanical planarization (CMP). However, other suitable methods commonly used in the art may be used. The material removal process also preferably removes anti-reflective coating 50 and portions of sidewall protection layer 44 lying on top of the anti-reflective coating. During this step, therefore, semiconductor material is preferably removed down to a depth sufficient to expose the upper parts of oxidized portion 42 of dielectric layer sidewalls 41. This exposes oxidized portion 42 to the environment inside the etching machine.

Figure 9:
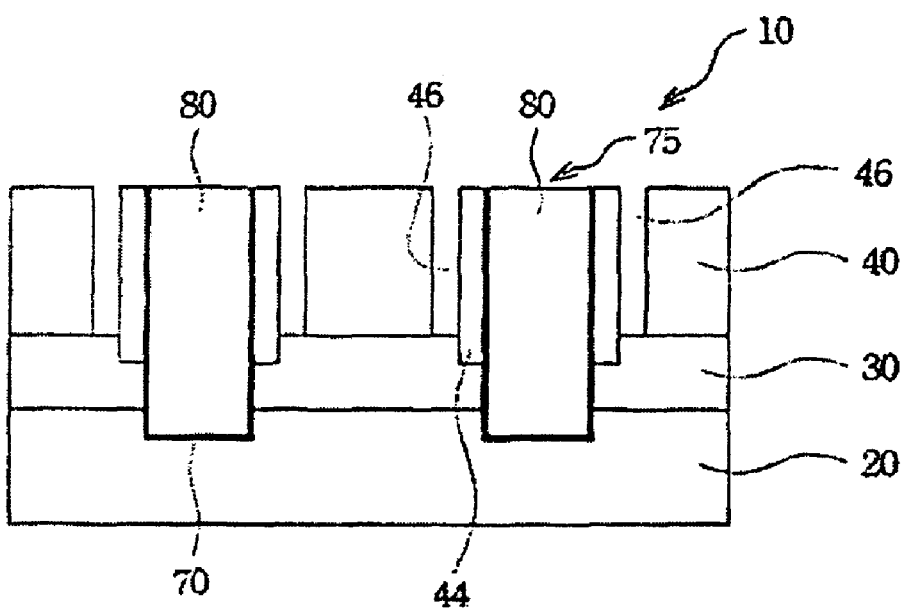

In the final step shown in FIG. 9, the oxidized portions 42 of dielectric layer 40 are dissolved and removed to leave or form air gaps 46 for isolating interconnect conductors 75, which includes metal conductors 80 and barrier layer 70. Chemicals and/or compositions in a liquid or gaseous state may be used to dissolve the oxidized portions 42 of the dielectric layer sidewalls 41 that were previously exposed in the step shown in FIG. 8. Also preferably, the chemicals and/or compositions selected do not substantially etch or damage the remaining semiconductor materials to a degree that might adversely affect the reliability of the semiconductor package. In a preferred embodiment, wet etching may be used to form air gaps 46 by dipping semiconductor 10 in a dilute hydrofluoric acid (HF) based solution that reacts with and dissolves oxidized portions 42, thereby forming the air gaps 46 as shown proximate to each interconnect conductor 75. The HF acid-based solution may be relatively dilute, which in some exemplary embodiments may contain 5% or less of HF acid. In one embodiment, the HF acid-based solution may contain approximately 1% concentration of HF acid. Such concentrations of HF acid may be used without significant adverse effects on the other semiconductor materials in the package. Representative dip times may be on the order of a few minutes to about 60 minutes depending on the concentration of the HF solution used, which affects the aggressiveness of the solution and material etching rates. Preferably, the chemicals and/or compositions selected do not damage the copper conductors 80. It will be appreciated that other chemicals and/or compositions, and dry etching techniques may be used to dissolve and remove oxidized portions 44 to form the air gaps. Accordingly, the invention is not limited by whether dry or wet etching processes are used, or the types of chemicals and/or compositions employed.

With continuing reference to FIG. 9, the interconnect spacers previously formed from sidewall protection layer 44 are preferably unaffected by the removal of oxidized portions 42. Accordingly, the final process step shown in FIG. 9 that forms air gaps 46 leaves the spacers intact. In contrast to prior art constructions, the spacers according to the preferred embodiment advantageously isolate the interconnect conductors 75 from the air gaps 46 to prevent oxidation of the conductors and concomitantly provide lateral support for the interconnects to prevent deformation or extrusion of the conductor materials into air gaps 46 during high current flux situations.

In some exemplary embodiments, the spacers formed from sidewall protection layer 44 may have a representative thickness without limitation of about +/−80 Angstroms and air gaps 46 may have a representative thickness without limitation of about +/−140 Angstroms. A line-to-line capacitance reduction of about 32% may be achieved with the foregoing representative construction. Other constructions and thicknesses, however, may be used according to principles of the present invention.

Additional layers of semiconductor materials and devices may subsequently be built on top of semiconductor 10 in the same foregoing manner described. Accordingly, the step shown in conjunction with FIG. 9 may be followed by depositing a capping layer on semiconductor 10 in a conventional manner (not shown).

Figure 11:
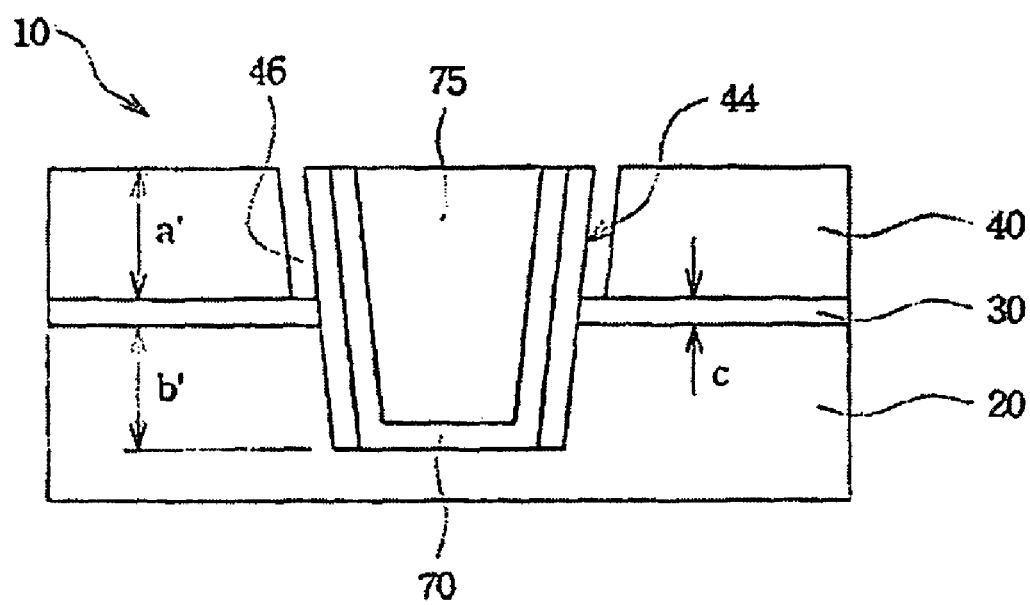

FIGS. 10 and 11 show a comparison of final substrate embodiments with interconnect structures produced according to the foregoing method. FIG. 10 depicts semiconductor 10 with interconnect conductor 75 in which the etching process shown in FIG. 3 is stopped before etch stop layer 30 is penetrated. Interconnect conductor 75 penetrates the substrate 20 to a depth "b" just below or proximate to the bottom of etch stop layer 30. By contrast, if the etching process shown in FIG. 3 penetrates etch stop layer 30, semiconductor 10 with interconnect conductor 75 will be produced as shown in FIG. 11. In the embodiment of FIG. 11, conductor 75 penetrates substrate 20 to a greater depth "b" than depth "b" shown in FIG. 10. The etch stop layer 30 has the same thickness in both embodiment of FIGS. 10 and 11.

The semiconductor 10 embodiment shown in FIG. 10 advantageously results in greater parasitic capacitance reduction between interconnects than the embodiment of FIG. 11 because conductor 75 penetrates less deeply into substrate 20. Therefore, there is a greater thickness of substrate 20 below conductor 75 than in FIG. 11 and greater separation/isolation between conductor 75 and any metallic conductors which may lie below conductor 75 (not shown). In addition, air gaps 46 shown in FIG. 11 do not extend along substantially the full depth of barrier layer 70 and conductor 75 as shown in FIG. 10. Therefore, the air gaps in FIG. 11 are less efficient and there is greater parasitic capacitance between laterally adjacent conductors 75 in semiconductor 10 than the embodiment of FIG. 10. Furthermore, the remaining thickness "a" of dielectric layer 40 above etch stop layer 30 in FIG. 10 is greater than the remaining thickness "a" in FIG. 11, which better isolates conductors.

According to another embodiment, a semiconductor 10 with interconnects can be formed according to the foregoing process with a sidewall protection layer 44 adjacent to the interconnect conductors, but without air gaps 46. This results in the semiconductor embodiment shown in FIG. 12, which provides better interconnect isolation than allowing the barrier layer 70 to directly contact dielectric layer 40. The semiconductor 10 of FIG. 12 can be formed by following the process steps already described herein above, with the elimination of steps associated with forming the air gaps.

Figure 12:
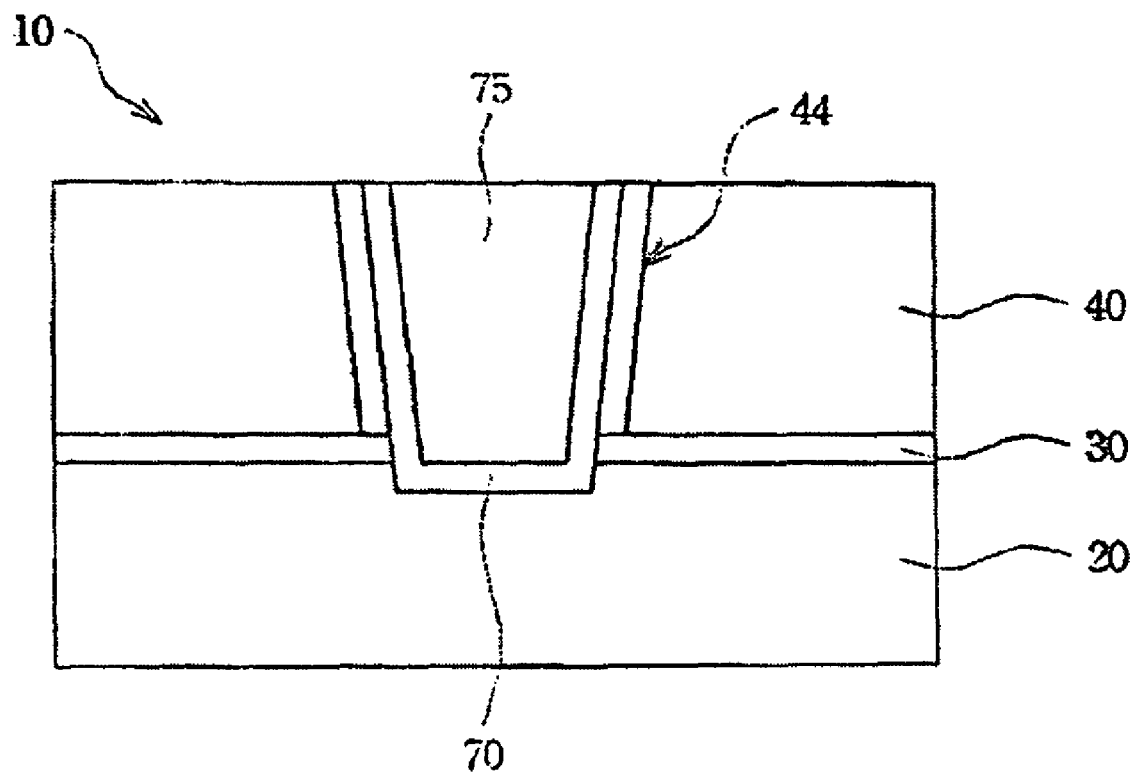
FIG. 12 shows a semiconductor package structure without air gaps formed according to the exemplary process of FIGS. 2-9.

In one possible embodiment, the formation of a sidewall protection layer 44 without air gaps may be completed by following the steps associated and described herein which include in order: (1) a first etching step for forming recesses 43, which preferably stops at or in etch stop layer 30 without penetrating the stop layer as shown in FIG. 3; (2) depositing sidewall protection layer 44 on the semiconductor 10 as shown in FIG. 5; (3) a second etching for removing selected portions of sidewall protection layer 44, as shown in FIG. 6 (with exception that oxidized sidewall portions 42 are not present); (4) forming metal interconnects by depositing barrier layer 70 first in recess 43 and then depositing conductive metal thereon to form interconnect conductors 75, as shows in FIG. 7; and finally (5) leveling or planing semiconductor 10 to remove the top portions of barrier layer 70 and interconnect conductors 75, as shown in FIG. 8. The semiconductor shown in FIG. 12 is thus produced.

The semiconductor 10 structure described herein is a single damascene interconnect layer, such as the M1 layer of an integrated circuit die. In some embodiments, substrate 20 may be a bulk semiconductor material or a semiconductor material including a plurality of layers with conductive paths or traces, passive devices, and/or active devices. Substrate 20 may further include one or more interconnect layers in some embodiments formed above the passive and active devices. Although the semiconductor 10 structure may be an M1 layer, it will be appreciated that semiconductor 10 may also be formed at another level above the M1 layer.

According to other embodiments, a semiconductor structure 10 formed as described herein may be a dual damascene interconnect layer (not shown), such as the M2/V1 via layer of an integrated circuit die described in commonly assigned copending U.S. patent application Ser. No. 11/342,099 which is incorporated herein by reference in its entirety. Such an M2/V1 layer may include M2 trenches. The semiconductor fabrication process described herein may be modified as described in U.S. patent application Ser. No. 11/342,099 to create dual damascene M2 layer having both vias and trenches, but wherein the second etching step described herein with reference to FIG. 6 preferably does not penetrate etch stop layer 30. In a dual damascene process according to principles of the present invention, M2 trenches may be formed after the step shown in FIG. 4 by applying a patterned photoresist layer over semiconductor 10 in a conventional manner and etching openings for the trenches, followed by ashing to remove the photoresist. The etch stop layer 30 would instead represent a capping layer deposited on top of a single damascene or dual damascene structure previously fabricated. Recesses 43 formed by prior process steps of FIGS. 1-3 described herein would be associated with creation of the M2/V1 vias. The steps shown in FIG. 5 and thereafter would then be performed as described herein to complete the dual damascene integrated circuit structure. Penetration of the capping layer (equivalent to etch stop layer 30, for example) by the second etching step shown in FIG. 6 would require etching to be done for a suitable duration of time to form vias deep enough to reach conductors disposed in the underlying pre-existing single damascene or dual damascene structure to subsequently complete electrical connections to that underlying structure by conductors 80. In one embodiment, this may be accomplished by setting the etching machine to "time control mode" wherein the etching time would be determined in part by the thickness of the capping layer and its material.

While the foregoing description and drawings represent preferred or exemplary embodiments of the present invention, it will be understood that various additions, modifications and substitutions may be made therein without departing from the spirit and scope and range of equivalents of the accompanying claims. In particular, it will be clear to those skilled in the art that the present invention may be embodied in other forms, structures, arrangements, proportions, sizes, and with other elements, materials, and components, without departing from the spirit or essential characteristics thereof. One skilled in the art will further appreciate that the invention may be used with many modifications of structure, arrangement, proportions, sizes, materials, and components and otherwise, used in the practice of the invention, which are particularly adapted to specific environments and operative requirements without departing irons the principles of the present invention. In addition, numerous variations in the preferred or exemplary methods and processes described herein may be made without departing from the spirit of the invention. The presently disclosed embodiments are therefore to be considered in all respects as illustrative and not restrictive, the scope of the invention being defined by the appended claims and equivalents thereof, and not limited to the foregoing description or embodiments. Rather, the appended claims should be construed broadly, to include other variants and embodiments of the invention, which may be made by those skilled in the art without departing from the scope and range of equivalents of the invention.

What is claimed is:

1. A method for forming a multi-layered semiconductor structure comprising:
   forming an etch stop layer on a silicon substrate;
   forming a dielectric layer on the etch stop layer;
   forming an anti-reflective coating on the dielectric layer;
   forming a patterned photoresist layer on the anti-reflective coating;
   using an etching gas to form an interconnect recess in the dielectric layer for creating an electrical interconnect, the recess defining an exposed sidewall in the dielectric layer and further exposing the etch stop layer, wherein the recess does not penetrate the etch stop layer;
   using an ashing gas to oxidize at least a portion of the exposed dielectric sidewall;
   depositing a non-metallic sidewall protective layer on the anti-reflective coating, oxidized portion of dielectric sidewall to encapsulate the oxidized portion, and the etch stop layer;
   using an anisotropic etching gas process to remove the sidewall protective layer from the etch stop layer and anti-reflective coating, wherein at least a portion of the sidewall protective layer remains to define a non-metallic spacer;
   depositing an electrically conductive material in the recess adjacent to the spacer;
   removing the anti-reflective coating to expose at least an upper portion of the oxidized portion of the dielectric sidewall;
   removing the oxidized portion of the dielectric sidewall to form an air gap between the spacer and the dielectric layer,
   wherein the electrically conductive material is supported by and isolated from the air gap by the non-metallic spacer.

2. The method of claim 1, wherein the oxidized portion is removed by dissolving the oxidized portion with a hydrofluoric acid based solution.

3. The method of claim 1, wherein the anti-reflective coating removing step includes using chemical mechanical planarization to expose the upper portion of the oxidized portion of the dielectric sidewall.

4. A method for forming a multi-layered semiconductor structure with air gaps comprising:
   providing a multi-layered semiconductor package including a silicon substrate, an etch stop layer thereon, a dielectric layer thereon, and a protective coating thereon being resistant to at least ashing to protect the dielectric layer;
   forming a recess through the protective coating and into the dielectric layer for receiving a metallic conductor material to form an electrical interconnect, wherein an exposed sidewall is defined in the dielectric layer and the recess does not penetrate the etch stop layer;
   oxidizing at least a portion of the exposed dielectric vertical sidewall to form an oxidized vertical sidewall portion;
   depositing a non-metallic spacer material on the oxidized portion of the exposed dielectric sidewall in the recess, protective coating on the dielectric layer, and etch stop layer disposed at the bottom of the recess;

using an anisotropic etching gas process to selectively remove the non-metallic space material from the etch stop layer and protective coating, wherein the non-metallic spacer material remains only on the oxidized vertical sidewall portion of the dielectric sidewall in the recess;

depositing a refractory metal barrier liner over the non-metallic spacer material;

depositing a metallic conductor material in the recess over the refractory metal barrier liner; and dissolving the oxidized portion of the dielectric sidewall to form an air gap between the spacer material and the dielectric layer, wherein the refractory metal barrier liner and metallic conductor material are supported by and isolated from the air gap by the non-metallic spacer material.

5. The method of claim 4, wherein the spacer material is selected from the group consisting of SiN, SiC, and SiON.

6. The method of claim 4, further comprising planarizing an upper portion of the semiconductor structure after depositing the conductive material to remove at least some of the conductive material and the protective coating to expose the oxidized portion of sidewall.

7. The method of claim 4, wherein the oxidizing step includes exposing the exposed sidewall to an oxygen plasma ashing gas.

* * * * *

UNITED STATES PATENT AND TRADEMARK OFFICE
CERTIFICATE OF CORRECTION

PATENT NO. : 7,754,601 B2
APPLICATION NO. : 12/132233
DATED : July 13, 2010
INVENTOR(S) : Hsien-Wei Chen et al.

Page 1 of 1

It is certified that error appears in the above-identified patent and that said Letters Patent is hereby corrected as shown below:

Column 10, Line 21, replace the first occurrence of "b" with -- "b'" --.

Signed and Sealed this

Twenty-eighth Day of September, 2010

David J. Kappos
*Director of the United States Patent and Trademark Office*

UNITED STATES PATENT AND TRADEMARK OFFICE
CERTIFICATE OF CORRECTION

PATENT NO. : 7,754,601 B2  Page 1 of 1
APPLICATION NO. : 12/132233
DATED : July 13, 2010
INVENTOR(S) : Hsien-Wei Chen et al.

It is certified that error appears in the above-identified patent and that said Letters Patent is hereby corrected as shown below:

Column 10, Line 39, delete "a" and insert -- "a' " -- therefor.

Signed and Sealed this
Twenty-eighth Day of December, 2010

David J. Kappos
*Director of the United States Patent and Trademark Office*